(12) United States Patent
Kwak et al.

(10) Patent No.: US 9,140,835 B2
(45) Date of Patent: Sep. 22, 2015

(54) DISPLAY PANEL, COLOR FILTER SUBSTRATE, AND METHOD OF MANUFACTURING THE SAME

(71) Applicant: Samsung Display Co., Ltd., Yongin, Gyeonggi Do (KR)

(72) Inventors: Chang-Hun Kwak, Suwon-si (KR); Jae-Jun Yu, Seoul (KR); Tae-Gyun Kim, Seoul (KR); Jang-Sub Kim, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 364 days.

(21) Appl. No.: 13/733,498

(22) Filed: Jan. 3, 2013

(65) Prior Publication Data

US 2013/0119471 A1 May 16, 2013

Related U.S. Application Data

(62) Division of application No. 12/838,758, filed on Jul. 19, 2010, now Pat. No. 8,368,852.

(30) Foreign Application Priority Data

Aug. 4, 2009 (KR) .................. 10-2009-0071791

(51) Int. Cl.
*G02F 1/1335* (2006.01)
*G02B 5/20* (2006.01)
*G02B 5/22* (2006.01)
*H01L 29/786* (2006.01)

(52) U.S. Cl.
CPC ............... *G02B 5/201* (2013.01); *G02B 5/223* (2013.01); *G02F 1/133516* (2013.01); *H01L 29/786* (2013.01); *G02F 1/133512* (2013.01)

(58) Field of Classification Search
CPC .................................... G02F 1/1335
See application file for complete search history.

(56) References Cited

U.S. PATENT DOCUMENTS

| 2010/0007975 A1 | 1/2010 | Tsao et al. |
| 2010/0033658 A1 | 2/2010 | Tsao et al. |

FOREIGN PATENT DOCUMENTS

| JP | 11095024 | 9/1999 |
| JP | 2002243931 | 8/2002 |
| JP | 2007316148 | 12/2007 |
| KR | 1020020071542 | 9/2002 |
| KR | 100506068 | 8/2005 |
| KR | 1020060115778 | 11/2006 |
| KR | 1020070077702 | 7/2007 |
| KR | 1020080025572 | 3/2008 |

*Primary Examiner* — Timothy L Rude
(74) *Attorney, Agent, or Firm* — Cantor Colburn LLP

(57) ABSTRACT

A display panel includes; a substrate, and a light blocking structure surrounding an ink filling region on the substrate, the light blocking structure including; a first layer pattern having an ink affinity characteristic disposed on the substrate, and a second layer pattern positioned on the first layer pattern and including an organic material having a light blocking characteristic.

8 Claims, 12 Drawing Sheets

DISPLAY PANEL, COLOR FILTER SUBSTRATE, AND METHOD OF MANUFACTURING THE SAME

CROSS REFERENCE TO RELATED APPLICATIONS

This application is a divisional of U.S. application Ser. No. 12/838,758, filed on Jul. 19, 2010, which claims priority to Korean Patent Application No. 10-2009-0071791, filed on Aug. 4, 2009, and all the benefits accruing therefrom under 35 U.S.C. §119, the content of which in its entirety is herein incorporated by reference.

BACKGROUND OF THE INVENTION (a) Field of the Invention

The present invention relates to a display panel, a color filter substrate including the same, and a manufacturing method thereof. In detail, the present invention relates to a display panel that may be widely used in various electronic devices, such as a liquid crystal display ("LCD"), a color filter substrate including the same, and a manufacturing method thereof.

(b) Description of the Related Art

Currently, various types of flat panel displays are being developed. Among the various types of flat panel display, a liquid crystal display ("LCD") is widely used, and an organic light emitting diode device ("OLED device") is also gaining prominence.

The LCD or the OLED device may include a color filter for producing a full color display. The color filter may be produced using an inkjet method.

In the typical inkjet method, various inks having red, green, or blue colors are filled in a plurality of ink filling regions defined by a light blocking structure to form the color filter.

However, in the process of applying the inkjet method, when the ink is insufficiently filled in the ink filling region, light leakage may be generated at a space where the ink is not filled. Also, when the height of the ink is extremely high in the ink filling region, the color filter appears as a faded color at the side of the ink filling region such that a degradation of lateral visibility may be generated.

BRIEF SUMMARY OF THE INVENTION

An exemplary embodiment of the present invention provides a display panel which prevents light leakage and degradation of lateral visibility of a display using the display panel.

Another exemplary embodiment of the present invention provides a manufacturing method of the above-described display panel.

Another exemplary embodiment of the present invention provides a color filter substrate including the above-described display panel.

An exemplary embodiment of a display panel according to the present invention includes; a substrate, and a light blocking structure surrounding an ink filling region on the substrate, the light blocking structure including; a first layer pattern which has an ink affinity characteristic, wherein the first layer pattern is disposed on the substrate, and a second layer pattern positioned on the first layer pattern and made of an organic material which has a light blocking characteristic.

In one exemplary embodiment, the first layer pattern may include a metal having the ink affinity characteristic. In one exemplary embodiment, the metal may be at least one selected from the group consisting of copper, titanium, tantalum, aluminum, iridium, ruthenium, platinum, tungsten, cobalt, chromium, radium, nickel and combinations thereof. In one exemplary embodiment, they may be used singularly or as a mixture.

In one exemplary embodiment, the first layer pattern includes a plurality of separate portions wherein adjacent portions may be separated by a first interval to form a pair, and the second layer pattern may fill the first interval. In one exemplary embodiment, the outer side of the first layer pattern may have a reversed-taper shape such that its width increases with distance from the substrate. In one exemplary embodiment, the substrate may be treated with a plasma to form the ink affinity characteristic. In one exemplary embodiment, the organic material may be treated with a plasma to form the ink resistance characteristic. In one exemplary embodiment, the plasma treatment may use a fluoride carbon.

According to another exemplary embodiment, a color filter substrate of the present invention includes; a light blocking structure which surrounds an ink filling region on a substrate, wherein the light blocking structure includes; a first layer pattern which has an ink affinity characteristic wherein the first layer pattern is disposed on the substrate, and a second layer pattern positioned on the first layer pattern and made of an organic material which has a light blocking characteristic, and a color filter which includes at least one of a red color filter, a green color filter, and a blue color filter disposed within the ink filling region through inkjet printing.

In one exemplary embodiment, the first layer pattern may include a metal having the ink affinity characteristic, and the second layer pattern is plasma treated to have an ink resistance characteristic. In one exemplary embodiment, the first layer pattern includes a plurality of separate portions wherein adjacent portions may be separated by a first interval to form a pair, and the second layer pattern may fill the first interval.

An exemplary embodiment of a method for manufacturing a display panel includes; disposing a first layer pattern which has an ink affinity characteristic and surrounding an ink filling region on a substrate, covering the first layer pattern on the substrate with a second layer pattern, wherein the second layer pattern includes an organic material having a light blocking characteristic, plasma treating the second layer pattern to provide the second layer pattern with an ink resistance characteristic, wherein the second layer pattern having the ink resistance characteristic and the first layer pattern together form a light blocking structure, and disposing a color filter including at least one of a red color filter, a green color filter, and a blue color filter surrounded by the light blocking structure via inkjet printing.

In one exemplary embodiment, the method may further include wet etching the first layer pattern to have a reversed-taper shape increasing in width with distance form the substrate after covering the first layer pattern with the second layer pattern. In one exemplary embodiment, the plasma treating includes using a fluoride carbon. In one exemplary embodiment, a width of the first layer pattern may be equal to or less than the width of the second layer pattern.

According to another exemplary embodiment of the present invention, a color filter substrate includes; a substrate, a thin film transistor disposed on the substrate, a passivation layer which covers the thin film transistor, a first layer pattern which surrounds an ink filling region on the passivation layer, and which has an ink affinity characteristic, a second layer pattern disposed on the first layer pattern and which includes an organic material which has a light blocking characteristic, and a color filter including at least one of a red color filter, a green color filter, and a blue color filter disposed in the ink filling region, wherein the color filter is formed by inkjet printing. In one exemplary embodiment, the first layer pattern may include a metal having the ink affinity characteristic. In one exemplary embodiment, an outer side of the first layer pattern may have a reversed-taper shape such that a width of the first layer pattern increases with distance from the substrate.

According to another exemplary embodiment of the present invention, a color filter substrate includes; a substrate, a thin film transistor disposed on the substrate, a passivation layer which covers the thin film transistor and exposes at least one of a source electrode and a drain electrode of the thin film transistor, a light blocking pattern disposed on only a portion of the exposed electrode and which surrounds an ink filling region, and a color filter including at least one of a red color filter, a green color filter, and a blue color filter disposed on the ink filling region, wherein the color filter is formed via inkjet printing. In one exemplary embodiment, the outer side of the exposed electrode may have a reversed-taper shape such that a width of the first layer pattern increases with distance from the substrate.

According to the present invention, light leakage generated when the ink filling region is insufficiently filled with the ink may be prevented. The degradation of the lateral visibility that the color filter appears as a faded color at the side when the height of the ink is relatively high may be prevented.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
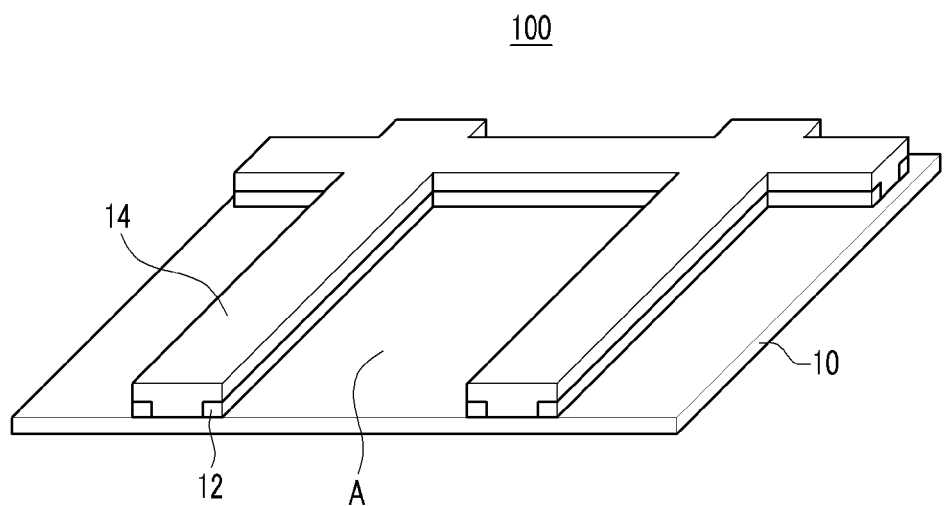
FIG. 1 is a front perspective cutaway view illustrating an exemplary embodiment of a display panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", an and the are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

<Display Panel 1>

FIG. 1 is a front perspective cutaway view illustrating an exemplary embodiment of a display panel according to the present invention.

Referring to FIG. 1, a display panel 100 includes first layer patterns 12 and second layer patterns 14 that are disposed on a substrate 10.

Exemplary embodiments of the substrate 10 may include silicon, but the substrate 10 is not limited thereto. When the substrate 10 includes silicon, the outer surface of the substrate 10 may have an ink affinity characteristic imparted through a plasma treatment process using fluoride carbon. That is, when the plasma treatment process using the fluoride carbon, one exemplary embodiment of which is $CF_4$, is executed on the substrate 10 including the silicon, silicon tetrafluoride $SiF_4$ is generated from the outer surface of the substrate 10 such that the characteristics thereof is changed such that the substrate 10 may have the ink affinity characteristic.

The first layer pattern 12 disposed on the substrate 10 defines ink filling regions A in which ink will be filled as described in detail below. Also, in one exemplary embodiment the first layer pattern 12 includes a metal, thereby imparting an ink affinity characteristic to the first layer pattern 12. The first layer pattern 12 may include many individual branches as illustrated in FIG. 1, wherein individual branches of the first layer pattern are separated by a predetermined interval.

Exemplary embodiments of the metal included in the first layer pattern 12 may be copper, titanium, tantalum, aluminum, iridium, ruthenium, platinum, tungsten, cobalt, chromium, radium, nickel, combinations thereof or other materials having similar characteristics. Exemplary embodiments include configurations wherein the above listed materials may be used solely or as a mixture.

The second layer pattern 14 is formed to fill regions between branches of the first layer pattern 12 on the substrate 10. That is, as briefly described above, portions of the first layer pattern 12 are separated from each other by a first interval therebetween and the separated portions of the first layer pattern 12 are formed as a pair, and the second layer pattern 14 fills the first interval between the separate portions of the first layer pattern 12. In one exemplary embodiment, a width of the first layer pattern 12 including the interval between adjacent portions of the first layer pattern 12, may be equal to or less than a width of the second layer pattern 14. Also, in the present exemplary embodiment the second layer pattern 14 includes an organic material including carbon, thereby imparting a light blocking characteristic to the second layer pattern 14.

The outer surface of the second layer pattern 14 may have an ink resistance characteristic, i.e., an ink aversion characteristic, imparted through plasma treatment using fluoride carbon. That is, when the plasma treatment using the fluoride carbon such as $CF_4$ is executed for the second layer pattern 14 including the carbon, fluoride (F) or $CF_3$ is adhered to the carbon included in the outer surface of the second layer pattern 14 such that the second layer pattern 14 may have the ink resistance characteristic.

FIGS. 2 to 6 are front perspective cutaway views illustrating an exemplary embodiment of a method of manufacturing the exemplary embodiment of a display panel shown in FIG. 1.

Figure 2:
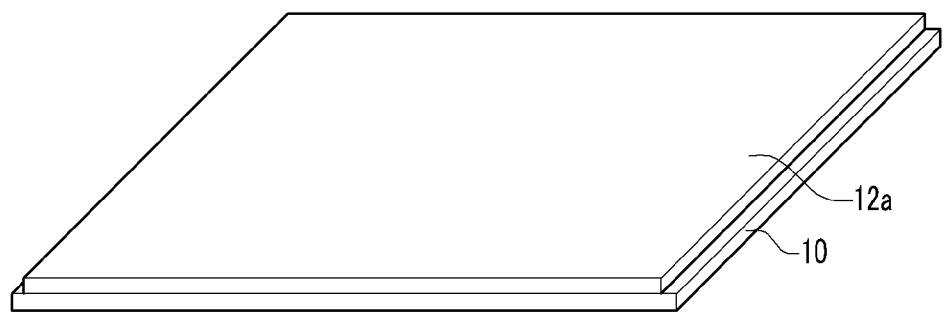
FIGS. 2 to 6 are front perspective cutaway views illustrating an exemplary embodiment of a method of manufacturing the an exemplary embodiment of display panel shown in FIG. 1.

Referring to FIG. 2, a first layer 12a is formed on the substrate 10. Exemplary embodiments include configurations wherein the substrate 10 may include silicon, but the present invention is not limited thereto. The first layer 12a may include the ink affinity metal as described above. The metal included in the first layer 12a may be copper, titanium, tantalum, aluminum, iridium, ruthenium, platinum, tungsten, cobalt, chromium, radium, nickel, combinations thereof or other materials having similar characteristics. Exemplary embodiments include configurations wherein they may be used solely or as a mixture.

Figure 3:
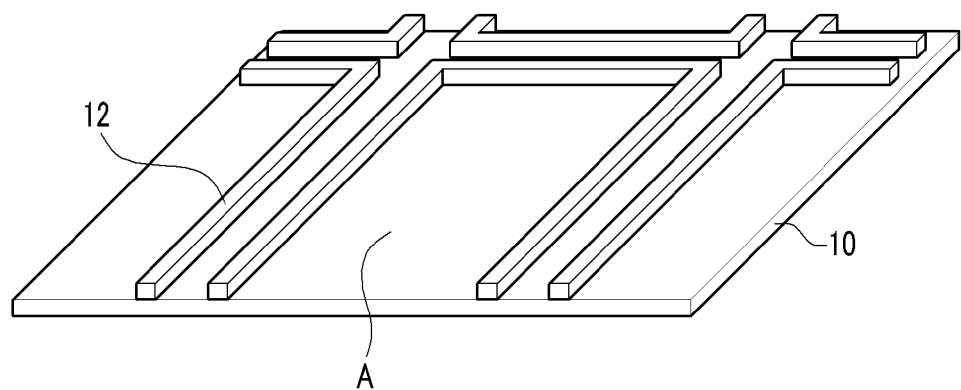

Referring to FIG. 3, the first layer 12a is etched to form the first layer patterns 12. The first layer patterns 12 define ink filling regions A for the ink to be filled in a following process, e.g., in the embodiment illustrated in FIG. 3 the first layer patters 12 may be described as a series of independent rectangles, or may be described as a plurality of pairs of adjacent portions extending in a first direction and a plurality of pairs of adjacent portions extending in a second direction substantially perpendicular to the first direction. The first layer pattern 12 is formed by etching the first layer 12a having the ink affinity metal, thereby forming the first layer pattern 12 having the ink affinity characteristic.

Figure 4:
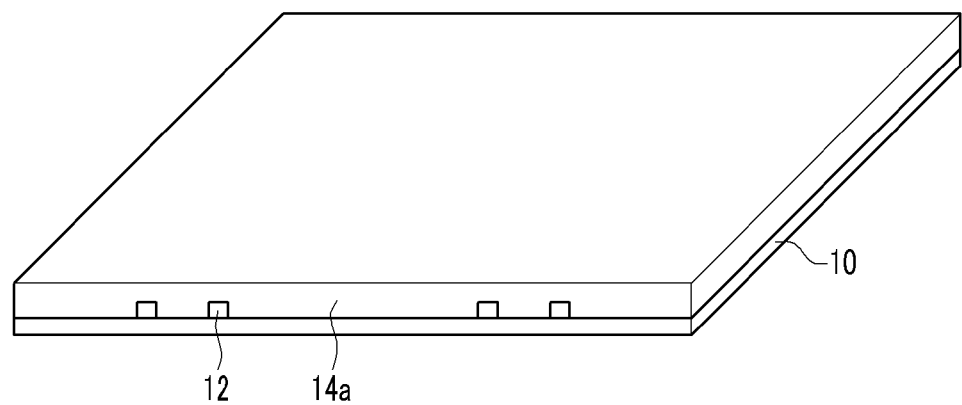

Referring to FIG. 4, a second layer 14a covering the first layer patterns 12 is formed on the substrate 10. As described above, exemplary embodiments of the second layer 14a may be formed of the organic material including carbon, thereby imparting the light blocking characteristic to the second layer 14a.

Figure 5:
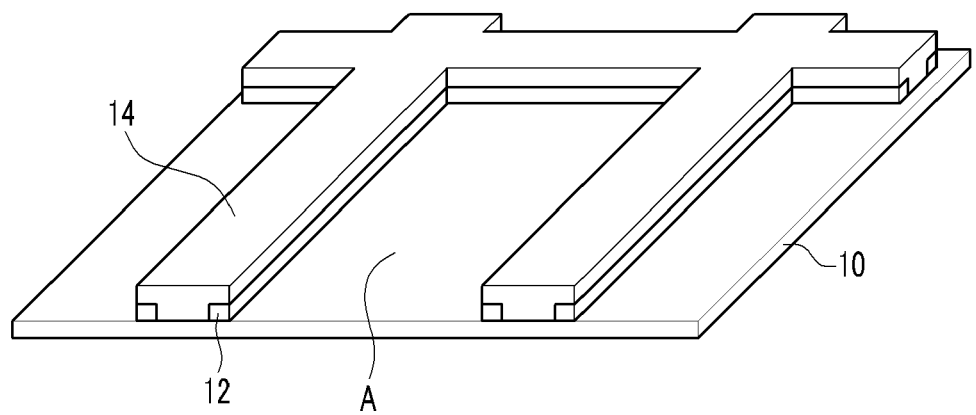

Referring to FIG. 5, the second layer 14a is etched to form the second layer pattern 14. The second layer pattern 14 is formed to fill the portions between portions, e.g., branches, of the first layer patterns 12 on the first layer patterns 12. Here, the width of the first layer pattern 12, including the predetermined interval between pairs of the first layer pattern 12, may be substantially equal to or less than the width of the second layer pattern 14.

Figure 6:
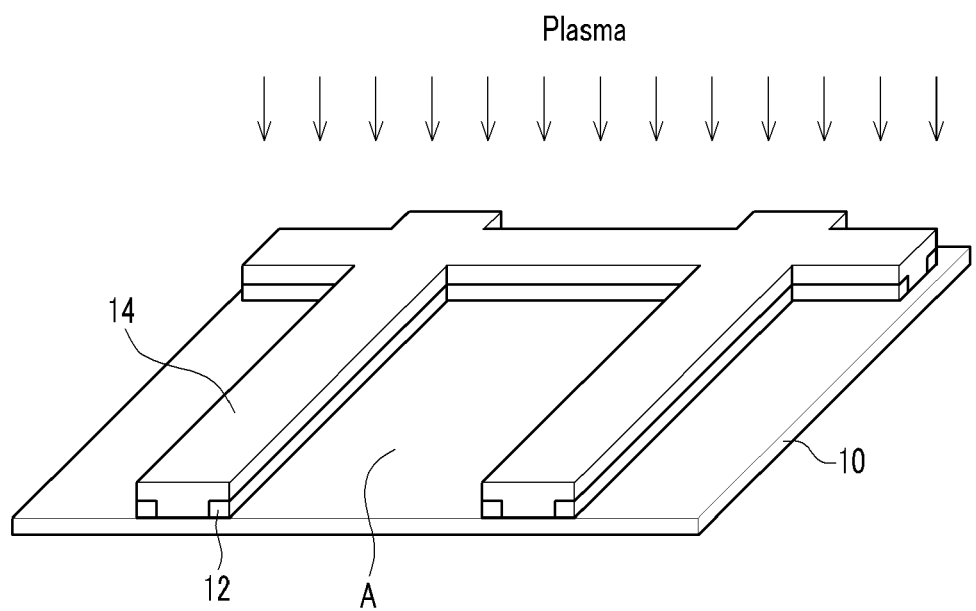

Referring to FIG. 6, the plasma treatment using the fluoride carbon is executed on the substrate 10 and the second layer pattern 14 to form the display panel 100 shown in FIG. 1. In one exemplary embodiment the outer surface of the substrate 10 may have the ink affinity characteristic imparted through the plasma treatment. In addition, the outer surface of the second layer pattern 14 has the ink resistance characteristic imparted through the plasma treatment.

In detail, when the plasma treatment using the fluoride carbon such as $CF_4$ is executed on the substrate 10 including silicon, silicon tetrafluoride $SiF_4$ is generated on the outer surface of the substrate 10 such that the ink affinity characteristic is changed and thereby the substrate 10 may have the ink affinity characteristic imparted thereto. In addition, when the plasma treatment using the fluoride carbon such as $CF_4$ is executed on the second layer pattern 14 including the carbon, fluoride (F) or $CF_3$ is adhered to the carbon included in the outer surface of the second layer pattern 14 and thereby the second layer pattern 14 may have the ink resistance characteristic imparted thereto. Thus, the same plasma treatment process may impart different ink favoring characteristics to different parts of the display panel 100.

<Display Panel 2>

Figure 7:
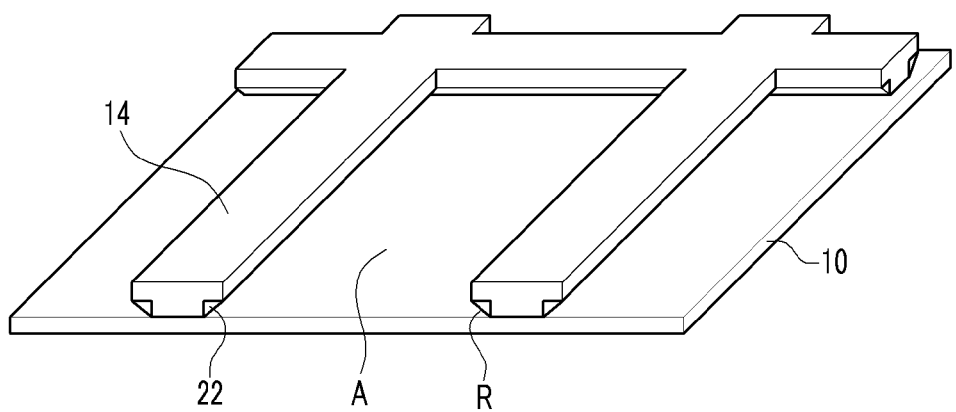
FIG. 7 is a front perspective cutaway view illustrating another exemplary embodiment of a display panel according to the present invention.

FIG. 7 is a front perspective cutaway view illustrating another exemplary embodiment of a display panel 200 according to the present invention. The present exemplary embodiment of a display panel 200 is substantially the same as the exemplary embodiment of a display panel 100 of FIG. 1, except for a first layer pattern 22. Accordingly, the same elements are designated by the same reference numerals, and the description thereof is omitted.

Referring to FIG. 7, the outer side of the first layer pattern 22 has a negative slope with respect to the substrate 10, e.g., it's cross-sectional area taken along a direction substantially normal to the substrate 10 increases with distance from the substrate 10. Accordingly, a recess R is formed under the display panel 200 including the first layer patterns 22 and the second layer pattern 14.

In detail, the outer side of the first layer pattern 22 has a reversed-taper shape with respect to the substrate 10, e.g., the first layer pattern 22 increases in width as distance from the substrate 10 increases. Accordingly, the inner side of the first layer pattern 22, e.g., a side between adjacent pairs of portions of the first layer pattern 22 is perpendicular to the substrate 10, and the outer side forms an acute angle with the substrate 10. Also, the width of the first layer pattern 22 is increased in an upward direction away from the substrate.

Figure 8:
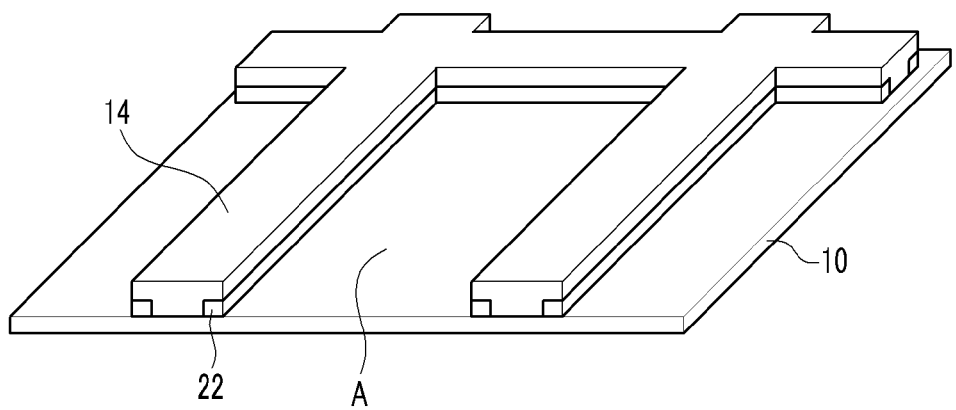
FIGS. 8 to 10 are front perspective cutaway views illustrating an exemplary embodiment of a method of manufacturing the exemplary embodiment of a display panel shown in FIG. 7.
Figure 9:
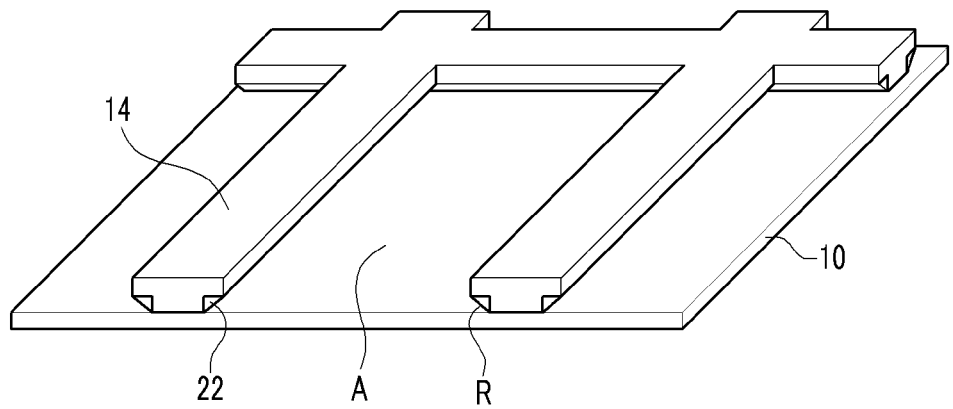
Figure 10:
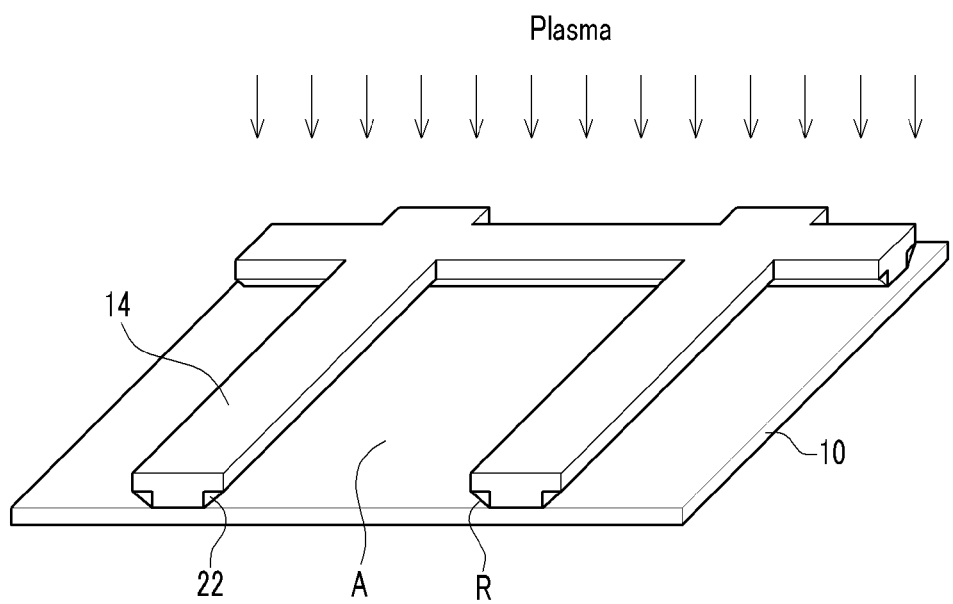

FIGS. 8 to 10 are front perspective cutaway views illustrating an exemplary embodiment of a method of manufacturing the exemplary embodiment of a display panel 200 shown in FIG. 7. According to the present exemplary embodiment a method of manufacturing the exemplary embodiment of a display panel 200 is substantially the same as the method of manufacturing the exemplary embodiment of a display panel 100 described in FIGS. 2 to 6, except for the process of forming the first layer patterns 22. Accordingly, the same elements are designated by the same reference numerals, and the description thereof is omitted.

Referring to FIG. 8, substantially the same process as illustrated in FIGS. 2 to 6 is executed to form the second layer pattern 14 filling the portions between the first layer patterns 22 on the first layer patterns 22 disposed on the substrate 10.

Referring to FIG. 9, the outer side of the first layer patterns 22 is etched to have the negative slope with respect to the substrate 10. In one exemplary embodiment, the etching for the outer side may be wet etching. Also, exemplary embodiments include configurations wherein the negative slope may be realized by an over-etching method. Accordingly, a recess R is formed under the display panel 200 including the first layer patterns 22 and the second layer pattern 14.

Referring to FIG. 10, plasma treatment using the fluoride carbon is executed on the substrate 10 and the second layer pattern 14 to form the display panel 100 shown in FIG. 7. Through the plasma treatment, the outer surface of the substrate 10 and the outer surface of the second layer pattern 14 respectively have the ink affinity characteristic and the ink resistance characteristic.

<Color Filter Substrate 1>

Figure 11:
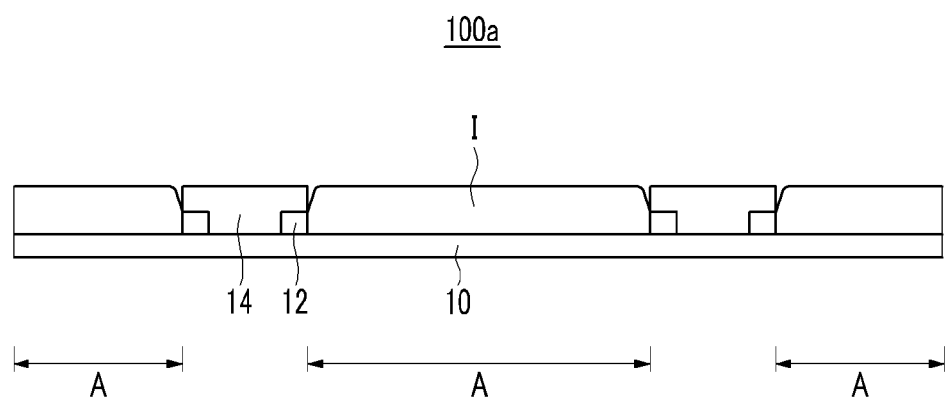
FIG. 11 is a cross-sectional view illustrating an exemplary embodiment of a color filter substrate manufactured by filling ink at an ink filling region of the exemplary embodiment of a display panel shown in FIG. 1.

FIG. 11 is a cross-sectional view illustrating an exemplary embodiment of a color filter substrate 100a manufactured by filling ink at an ink filling region A of the exemplary embodiment of a display panel 100 shown in FIG. 1.

Referring to FIG. 11, ink including at least one of red R, green G, and blue B is filled in the ink filling region A of the exemplary embodiment of a display panel 100 shown in FIG. 1 through inkjet printing.

When forming a color filter substrate 100a using the display panel 100 shown in FIG. 1, the ink I is sufficiently filled to the inner corner of the ink filling region A with a relatively thick thickness. This is because the substrate 10 and the second layer pattern 14 having the ink affinity characteristic and the ink resistance characteristic, respectively, increase the spread and the adhesion of the lower portion of the ink I. Accordingly, the light leakage deterioration generated when the ink I is not filled in the inner corner of the ink filling region A or when the thickness is relatively thin may be prevented.

Also, the substrate 10 and the second layer pattern 14 having the ink affinity characteristic and the ink resistance characteristic, respectively, increase the spread and the adhesion of the ink I such that the ink filling region A may be sufficiently filled with a relatively small amount of the ink I. Accordingly, the height of the ink I is decreased as compared to a similar color filter not having the ink affinity and resistance characteristics such that the degradation of the lateral visibility when the color filter appears as a faded color at the side when the height of the ink I is relatively higher than the second layer pattern 14 may be prevented. Specifically, because less ink I may be used, the height of the ink I may be decreased comparatively, and therefore the thickness of the ink I from different viewing angles will be more uniform.

<Color Filter Substrate 2>

Figure 12:
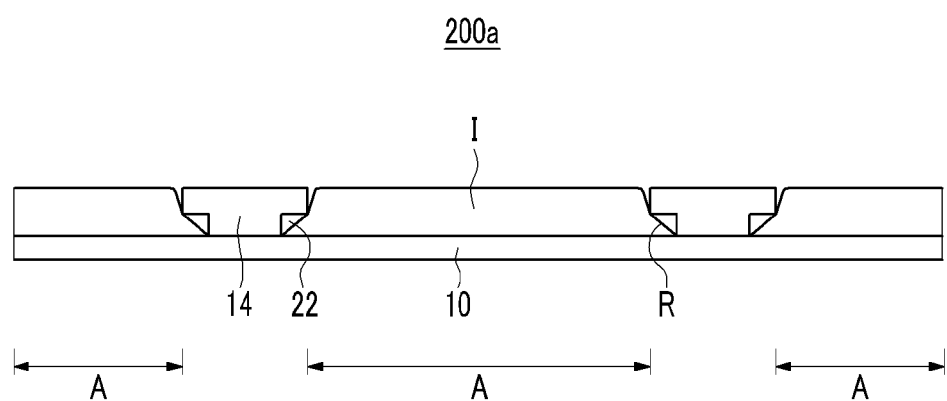
FIG. 12 is a cross-sectional view illustrating an exemplary embodiment of a color filter substrate manufactured by filling ink at an ink filling region of the exemplary embodiment of a display panel shown in FIG. 7.

FIG. 12 is a cross-sectional view illustrating an exemplary embodiment of a color filter substrate 200a manufactured by filling ink at an ink filling region of the exemplary embodiment of a display panel 200 shown in FIG. 7.

Referring to FIG. 12, the ink, including at least one of red R, green G, or blue B, is filled in the ink filling region A of the exemplary embodiment of a display panel 200 shown in FIG. 7 through inkjet printing.

Similar to that described above with respect to the formation of a color filter substrate 200 using the display panel 100 shown in FIG. 1, when forming a color filter substrate 200a using the display panel 200 shown in FIG. 7, the light leakage deterioration and the degradation of the lateral visibility may be prevented.

Also, the recess R is formed under the display panel 200. Accordingly, when filling the ink I in the ink filling region A, a capillary phenomenon is generated by the recess R such that the ink I is effectively filled to the inner corner of the ink filling region A.

<Color Filter Substrate 3>

Figure 13A:
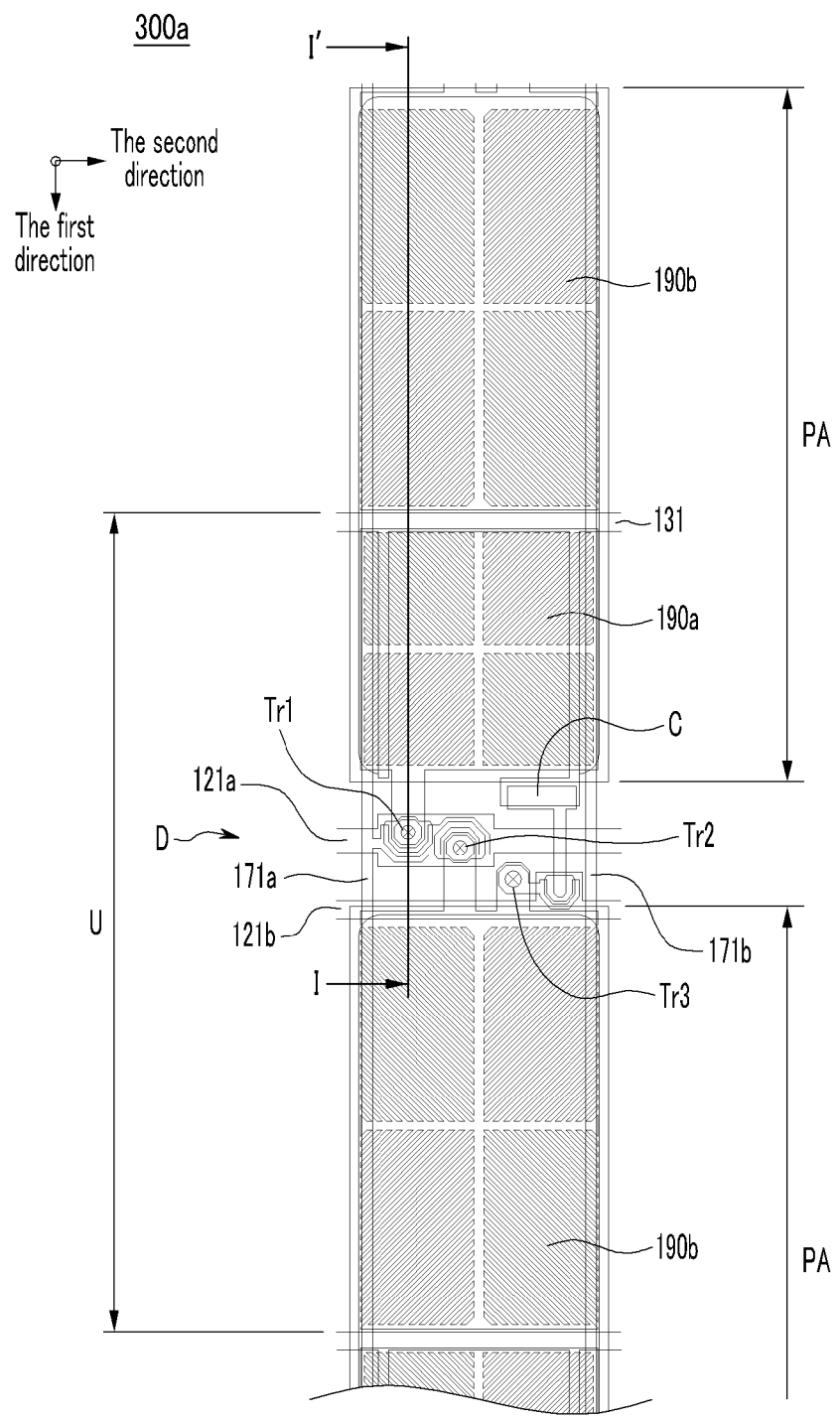
FIG. 13A and FIG. 13B are a top plan view illustrating an exemplary embodiment of a color filter substrate according to the present invention.
Figure 13B:
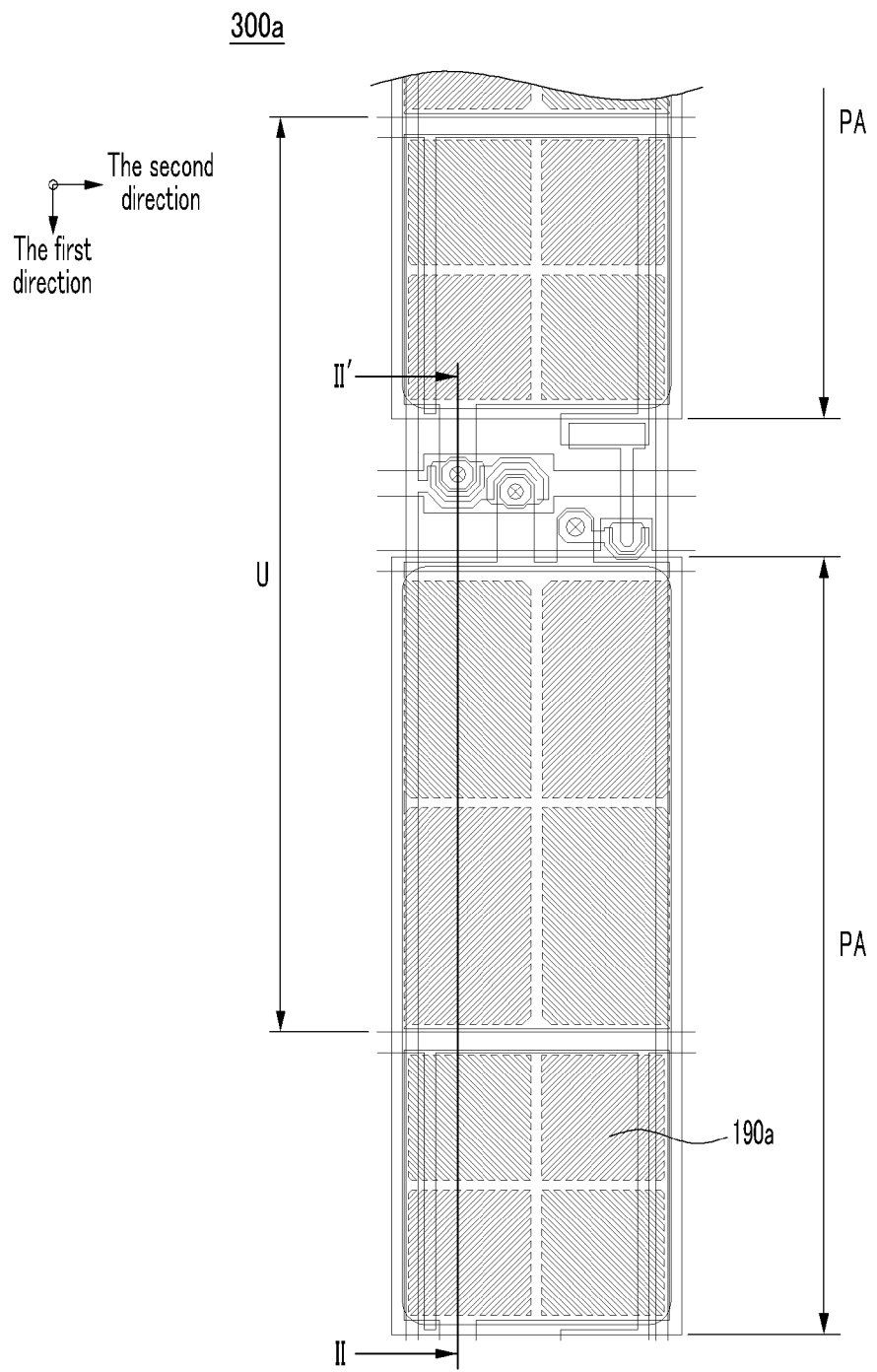
Figure 14:
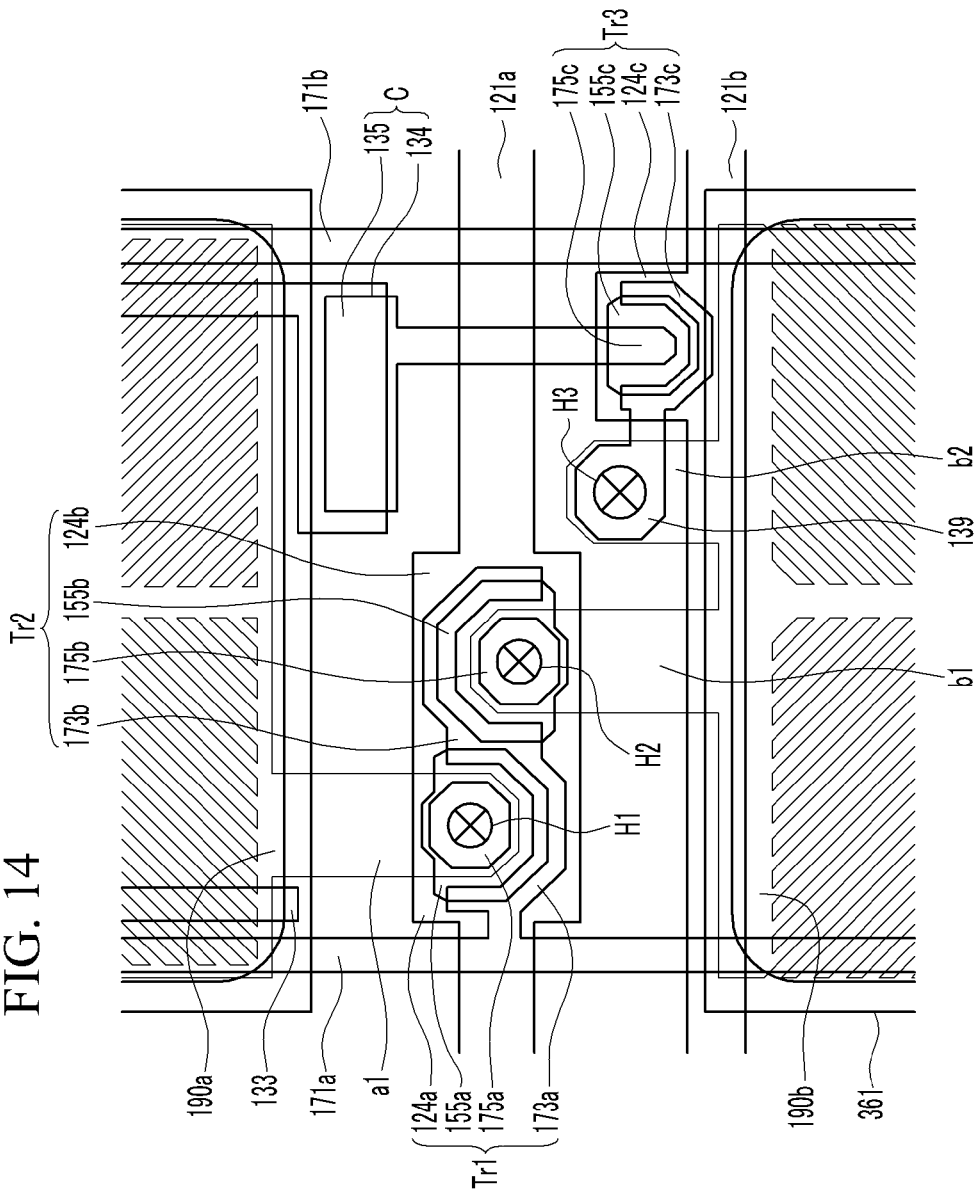
FIG. 14 is an enlarged view of the exemplary embodiment of a circuit driver shown in FIG. 13A.
Figure 15:
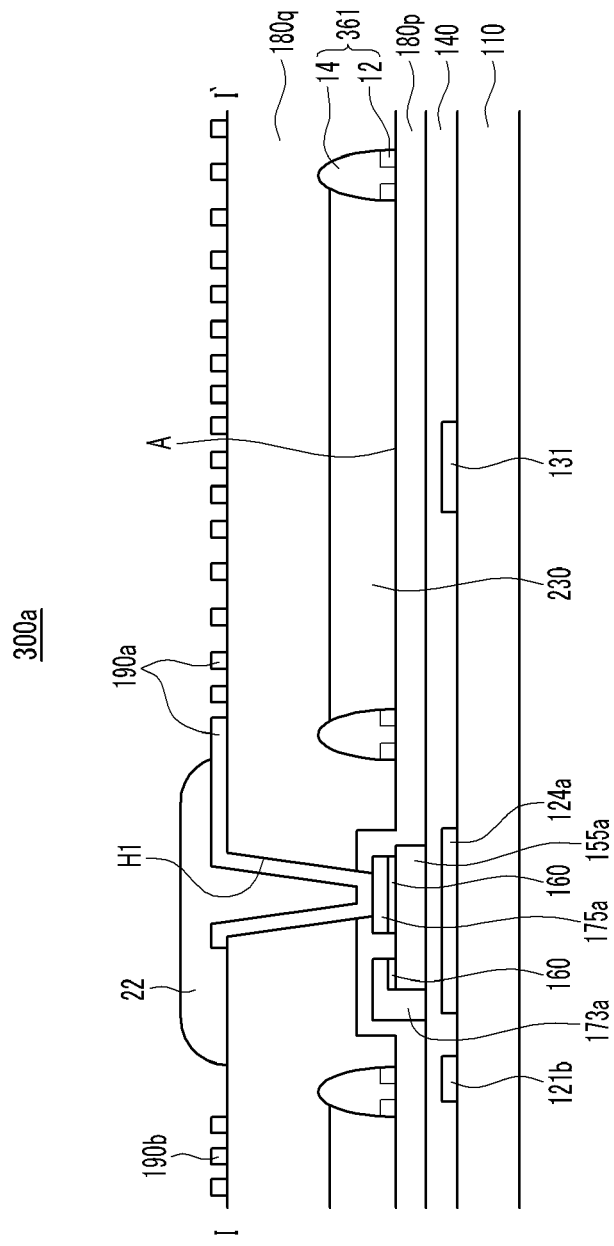
FIG. 15 is a cross-sectional view taken along line I-I' of FIG. 13A.
Figure 16:
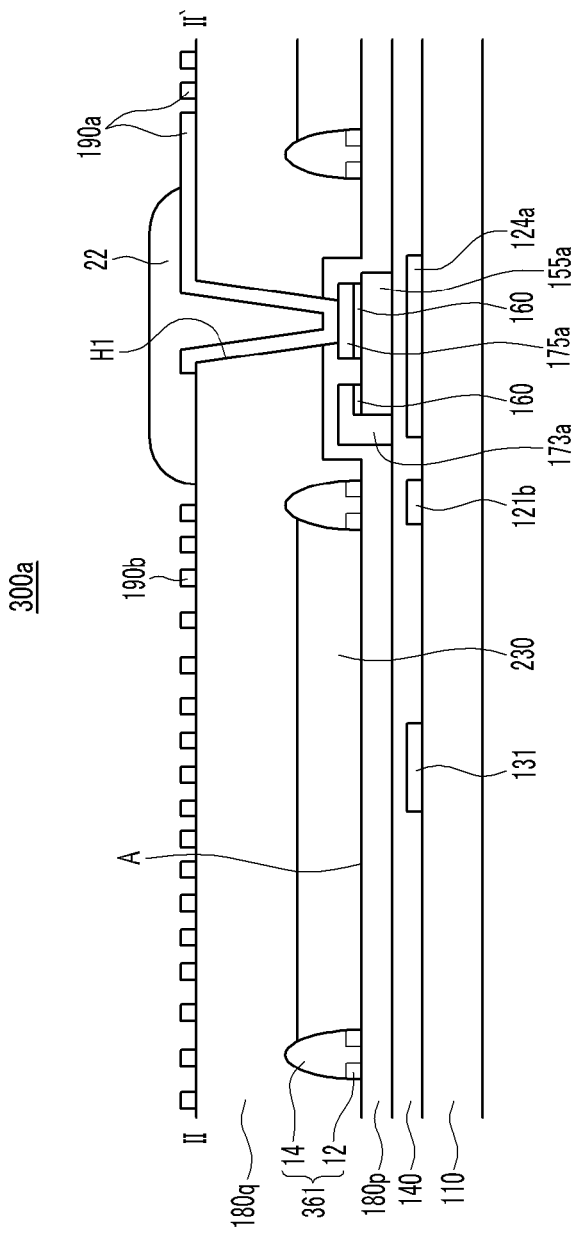
FIG. 16 is a cross-sectional view taken along line II-II' of FIG. 13B.

FIG. 13A and FIG. 13B are a top plan view illustrating an exemplary embodiment of a color filter substrate 300a according to the present invention. FIG. 14 is an enlarged view of an exemplary embodiment of a circuit driver shown in FIG. 13A. FIG. 15 is a cross-sectional view taken along line I-I' of FIG. 13A. FIG. 16 is a cross-sectional view taken along line II-IF of FIG. 13B.

Referring to FIG. 13A and FIG. 13B, an exemplary embodiment of a pixel includes a first pixel electrode 190a, a second pixel electrode 190b that is larger than the first pixel electrode 190a, and a driving circuit unit D disposed between the first pixel electrode 190a and the second pixel electrode 190b and including a transistor Tr as one formation unit U, and is continuously formed according to one direction through inkjet printing.

In one exemplary embodiment, when a region of substantially the same size as where the pixel electrodes are disposed is defined as a pixel area PA, the first pixel electrode 190a, the second pixel electrode 190b, and the driving circuit unit D may be formed as one formation unit U using the inkjet printing. In FIG. 13A and FIG. 13B, for convenience of the explanation, three pixel areas PA are shown, but alternative exemplary embodiments include configurations wherein the number of pixel areas PA may be increased.

The driving circuit unit D is disposed on a substrate 110. Hereafter, an exemplary embodiment of the driving circuit unit D including a first transistor Tr1, a second transistor Tr2, a third transistor Tr3, and a down capacitor C for implementing a charge sharing method is described, however the present invention is not limited thereto. For example, alternative exemplary embodiments of the driving circuit unit D may be exchanged for a charge pumping method.

Referring to FIGS. 13A and 14, the driving circuit unit D is described in detail. A storage electrode line 131, a storage electrode 133, a capacitor lower electrode 134, a first gate line 121a, a first gate electrode 124a, a second gate electrode 124b, a third gate electrode 124c, and a second gate line 121b are disposed on the substrate 110 (referring to FIGS. 15 and 16).

The storage electrode line 131, the first gate line 121a, and the second gate line 121b are separated along the first direction, and are sequentially arranged. Also, the storage electrode line 131, the first gate line 121a, and the second gate line 121b are extended according to the second direction substantially perpendicular to the first direction. In one exemplary embodiment, the storage electrode 133 may be a pair of electrodes, and in such an exemplary embodiment may extend from the storage electrode line 131 according to the first direction. The capacitor lower electrode 134 is extended from the storage electrode 133 along the second direction.

The first gate electrode 124a and the second gate electrode 124b are connected to the first gate line 121a. In one exemplary embodiment, a portion of the first gate line 121a having a wide width may be used as the first gate electrode 124a and the second gate electrode 124b. The third gate electrode 124c is connected to the second gate line 121b. In one exemplary embodiment, a portion of the second gate line 121b having a wide width may be used as the third gate electrode 124c.

A gate insulating layer 140 is formed on the storage electrode line 131, the storage electrode 133, the capacitor lower electrode 134, the first gate line 121a, the first gate electrode 124a, the second gate electrode 124b, the third gate electrode 124c, and the second gate line 121b (referring to FIGS. 15 and 16).

A first semiconductor pattern 155a, a second semiconductor pattern 155b, and a third semiconductor pattern 155c are respectively disposed on the first gate electrode 124a, the second gate electrode 124b, and the third gate electrode 124c on the gate insulating layer 140.

A first data line 171a is disposed at the left side of the pixel area PA on the gate insulating layer 140 and a second data line 171b is disposed at a right side of the pixel area PA on the gate insulating layer 140. In detail, the first data line 171a and the second data line 171b extend along the first direction, and are disposed outside of the first and second semiconductor patterns 155a and 155b.

A first source electrode 173a extends from the first data line 171a, and partially overlaps the first semiconductor pattern 155a. A second source electrode 173b extends from the first source electrode 173a and partially overlaps the second semiconductor pattern 155b. A third source electrode 173c partially overlaps the third semiconductor pattern 155c.

The first drain electrode 175a is separated from the first source electrode 173a on the first semiconductor pattern 155a. The second drain electrode 175b is separated from the second source electrode 173b on the second semiconductor pattern 155b. A third drain electrode 175c is separated from the third source electrode 173c on the third semiconductor pattern 155c. The drain electrodes 175a-c are separated from the source electrodes 173a-c by a semiconductor channel in the semiconductor patterns 155a-c respectively.

A contact region 139 has a shape extending from the third source electrode 173c. Also, a capacitor upper electrode 135 is extended from the third drain electrode 175c and overlaps the capacitor lower electrode 134.

A passivation layer 180p (referring to FIGS. 15 and 16) is formed on the above-described structures. Exemplary embodiments of the passivation layer 180p may include an organic material, but the present invention is not limited thereto. A light blocking structure 361 is disposed on the passivation layer 180p. The light blocking structure 361 is positioned to correspond to the outer part of the pixel area PA. That is, the light blocking structure 361 encloses the pixel area PA, similar to that illustrated with respect to the exemplary embodiment of a display panel 100 of FIG. 1.

The light blocking structure 361 includes the first layer pattern 12 and the second layer pattern 14 disposed on the first layer pattern 12, as described in FIGS. 1 to 6. Accordingly, the same reference numbers are used for the same reference elements, and the description is omitted.

Exemplary embodiments include configurations wherein the first layer pattern 12 may be exposed under the second layer pattern 14. The second layer pattern 14 is formed of the organic material including carbon, thereby having the light blocking characteristic. The outer surface of the second layer pattern 14 may have an ink resistance characteristic through the plasma treatment using fluoride carbon, as described in detail above.

A color filter 230 including at least one of red R, green G, or blue B is formed inside the ink filling region A defined by the light blocking structure 361. That is, the light blocking structure 361 is formed on the circumference of the pixel area PA such that the color filter 230 formed inside the light blocking structure 361 corresponds to the pixel area PA.

In one exemplary embodiment, the color filter 230 may be formed through inkjet printing. The first layer pattern 12 included in the light blocking structure 361 has the ink affinity characteristic and the second layer pattern 14 has the ink resistance characteristic such that the color filter 230 is sufficiently filled to the inner corners and edges of the ink filling region A and the height of the color filter 230 may be relatively lower than if the light blocking structure 361 were otherwise formed. Accordingly, the light leakage may be prevented, and the deterioration of the lateral visibility may be solved.

Also, an insulating layer 180q covering the light blocking structure 361 and the color filter 230 is formed on the passivation layer 180p. The insulating layer 180q and the passivation layer 180p have a first hole H1, a second hole H2, and a third hole H3 respectively exposing the first drain electrode 175a, the second drain electrode 175b, and the contact region 139.

The first pixel electrode 190a and the second pixel electrode 190b are disposed on the insulating layer 180q. The first pixel electrode 190a and the second pixel electrode 190b are disposed between the first data line 171a and the second data line 171b, and are oriented substantially opposite to each other via the first and second semiconductor patterns 155a and 155b.

In the present exemplary embodiment, the first pixel electrode 190a has an extension a1. The extension a1 of the first pixel electrode 190a is connected to the first drain electrode 175a through the first hole H1. In the present exemplary embodiment, the second pixel electrode 190b includes a first extension b1 and a second extension b2. The first extension b1 of the second pixel electrode 190b is connected to the second drain electrode 175b through the second hole H2. The second extension b2 of the second pixel electrode 190b is connected to the contact region 139 through the third hole H3.

The first gate electrode 124a, the first source electrode 173a, the first drain electrode 175a and the first semiconductor pattern 155a form the first transistor Tr1. The second gate electrode 124b, the second source electrode 173b, the second drain electrode 175b and the second semiconductor pattern 155b form the second transistor Tr2. The third gate electrode 124c, the third source electrode 173c, the third drain electrode 175c and the third semiconductor pattern 155c form the third transistor Tr3. The capacitor lower electrode 134, the gate insulating layer 140, and the capacitor upper electrode 135 form a down capacitor C.

The third transistor T3 may utilize a charge sharing effect between the first pixel electrode 190a and the second pixel electrode 190b. In detail, the third transistor Tr3 is turned on in the state that the first and 2 transistors Tr1 and Tr2 are turned on, and the charges are moved from the second pixel electrode 190b to the down capacitor C such that the voltage of the first pixel electrode 190a is maintained higher than the voltage of the second pixel electrode 190b. Accordingly, problems such as lateral visibility may be solved through the voltage difference between the first pixel electrode 190a and the second pixel electrode 190b.

Referring to FIGS. 13A and 15, in detail, the first transistor Tr1 included in the driving circuit unit D includes the first gate electrode 124a on the substrate 110, the gate insulating layer 140 on the first gate electrode 124a, the first semiconductor pattern 155a overlapping the first gate electrode 124a on the gate insulating layer 140, the first drain electrode 175a on the first semiconductor pattern 155a, the first source electrode 173a on the first semiconductor pattern 155a, an ohmic contact layer 160 between the first drain electrode 175a and the first semiconductor pattern 155a and the first source electrode 173a and the first semiconductor pattern 155a.

A light leakage preventing member 22 on the insulating layer 180q is disposed between the pixel areas PA on the driving circuit D. In the present exemplary embodiment, the light leakage preventing member 22 is made of an organic material including black pigment, thereby preventing the passage of the light therethrough, although alternative exemplary embodiments include alternative configurations.

In one exemplary embodiment, the light blocking member 22 may be positioned on the portion of the first pixel electrode 190a connected to the first drain electrode 175a of the first transistor Tr1 above the driving circuit unit D. In such an exemplary embodiment, the first pixel electrode 190a may fill the contact hole of the insulating layer 180q.

In the present exemplary embodiment, the light blocking structure 361 includes the first layer pattern 12 and the second layer pattern 14 that are described in FIGS. 1 to 6. However, alternative exemplary embodiments include configurations wherein the light blocking structure 361 may include the first layer pattern 22 and the second layer pattern 14 that are described in FIGS. 7 to 10.

<Color Filter Substrate 4>

Figure 17:
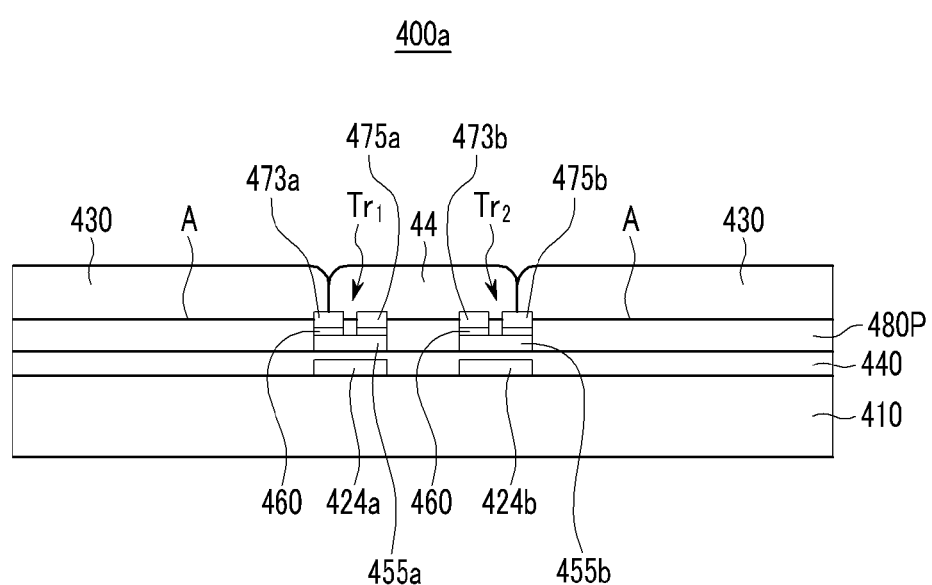
FIG. 17 is a cross-sectional view illustrating an exemplary embodiment of a color filter substrate according to the present invention.

FIG. 17 is a cross-sectional view illustrating an exemplary embodiment of a color filter substrate 400a according to the present invention.

Referring to FIG. 17, a first gate electrode 424a and a second gate electrode 424b are positioned on a substrate 410. Also, a gate insulating layer 440 covering the first gate electrode 424a and the second gate electrode 424b is formed on the substrate 410. A first semiconductor pattern 455a and a second semiconductor pattern 455b formed on the gate insulating layer 440 respectively correspond to the first gate electrode 424a and the second gate electrode 424b.

A first source electrode 473a and a first drain electrode 475a are positioned on the first semiconductor pattern 455a to be separated from each other with respect to the first gate electrode 424a. An ohmic contact layer 460 is positioned between the first semiconductor pattern 455a and the first source electrode 473a, and the first gate electrode 424a and the first drain electrode 475a.

A second source electrode 473b and a second drain electrode 475b are positioned on the second semiconductor pattern 455b to be separated from each other with respect to the second gate electrode 424b. The ohmic contact layer 460 is disposed between the second semiconductor pattern 455b and the second source electrode 473b, and the second gate electrode 424b and the second drain electrode 475b.

The first gate electrode 424a, the gate insulating layer 440, the first semiconductor pattern 455a, the ohmic contact layer 460, the first source electrode 473a and the first drain electrode 475a form the first transistor Tr1. Also, the second gate electrode 424b, the gate insulating layer 440, the second semiconductor pattern 455b, the ohmic contact layer 460, the second source electrode 473b and the second drain electrode 475b form the second transistor Tr2.

A passivation layer 480P covering the first and second transistors Tr1 and Tr2 is positioned on the substrate 410. In the present exemplary embodiment, the passivation layer 480P covering the first and second transistors Tr1 and Tr2 exposes the first source electrode 473a, the first drain electrode 475a, the second source electrode 473b, and the second drain electrode 475b. Also, exemplary embodiments include configurations wherein the passivation layer 480P may include the organic material, but the present invention is not limited thereto.

Here, the first source electrode 473a, the first drain electrode 475a, the second source electrode 473b, and the second drain electrode 475b include the ink affinity metal thereby having the function of the first layer pattern 12 of the above-described exemplary embodiments.

A light blocking pattern 44 made of the exemplary embodiment of the organic material including the carbon is formed on the passivation layer 480P. Here, the first source electrode 473a, the first drain electrode 475a, the second source electrode 473b, and the second drain electrode 475b are formed to be exposed in the ink filling region under the light blocking pattern 44.

The outer surface of the light blocking pattern 44 may have the ink resistance characteristic induced through a plasma treatment using fluoride carbon. That is, when the plasma treatment using the fluoride carbon such as $CF_4$ is executed for the light blocking pattern 44 including the carbon, fluoride (F) or $CF_3$ is adhered to the carbon included in the outer surface of the light blocking pattern 44 and thereby the second layer pattern 14 may have the ink resistance characteristic.

In the present exemplary embodiment, when the first source electrode 473a, the first drain electrode 475a, the second source electrode 473b, and the second drain electrode 475b are exposed to the plasma, a spark may be generated, however the spark may be suppressed in the exemplary embodiment wherein a remote plasma type is applied in the plasma treatment process.

A color filter 430 including at least one of red R, green G, or blue B is disposed on the ink filling region A. Here, the first source electrode 473a, the first drain electrode 475a, the second source electrode 473b, and the second drain electrode 475b having the ink affinity characteristic are exposed in the ink filling region under the light blocking pattern 44, wherein the light blocking pattern 44 has the ink resistance characteristic, such that the ink is relatively thickly and sufficiently filled to the corners and edges inside the ink filling region A. Accordingly, the light leakage deterioration generated when the ink I is not filled in the inner corner of the ink filling region A or the thickness is relatively thin may be prevented.

In the present exemplary embodiment, the outer side of the first source electrode 473a, the first drain electrode 475a, the second source electrode 473b, and the second drain electrode 475b that are exposed in the ink filling region under the light blocking pattern 44 do not have the reversed-taper structure, however, alternative exemplary embodiments include configurations wherein they may have the reversed-tapered structure, e.g., through wet etching from the outer side.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A color filter substrate comprising: a light blocking structure which surrounds an ink filling region on a substrate, wherein the light blocking structure comprises: a first layer pattern which has an ink affinity characteristic, wherein the first layer pattern is disposed on the substrate; and a second layer pattern positioned on the first layer pattern and including an organic material which has a light blocking characteristic; and a color filter which includes at least one of a red color filter, a green color filter, and a blue color filter disposed within the ink filling region through inkjet printing, wherein the first layer pattern includes a plurality of separate portions wherein adjacent portions are separated by a first interval to form a pair, and the second layer pattern fills the first interval.

2. The color filter substrate of claim 1, wherein the first layer pattern includes a metal having the ink affinity characteristic, and the second layer pattern is plasma treated to have an ink resistance characteristic.

3. A method for manufacturing a display panel the method comprising: disposing a first layer pattern which has an ink affinity characteristic and wherein the first layer pattern surrounds an ink filling region on a substrate; covering the first layer pattern on the substrate with a second layer pattern, wherein the second layer pattern includes an organic material which has a light blocking characteristic; plasma treating the second layer pattern to provide the second layer pattern with an ink resistance characteristic, wherein the second layer pattern having the ink resistance characteristic and the first layer pattern together form a light blocking structure; and disposing a color filter which includes at least one of a red color filter, a green color filter, and a blue color filter surrounded by the light blocking structure via inkjet printing, further comprising: wet etching the first layer pattern to have a reversed-taper shape increasing in width with distance from the substrate after covering the first layer pattern with the second layer pattern.

4. The method of claim 3, wherein the plasma treating includes using a fluoride carbon.

5. The method of claim 3, wherein a width of the first layer pattern is equal to or less than a width of the second layer pattern.

6. A color filter substrate comprising: a substrate; a thin film transistor disposed on the substrate; a passivation layer which covers the thin film transistor; a first layer pattern which surrounds an ink filling region on the passivation layer, and which has an ink affinity characteristic; a second layer pattern disposed on the first layer pattern and which includes an organic material which has a light blocking characteristic; and a color filter which includes at least one of a red color filter, a green color filter, and a blue color filter disposed in the ink filling region, wherein the color filter is formed via inkjet printing, wherein an outer side of the first layer pattern has a reversed-taper shape such that a width of the first layer pattern increases with distance from the substrate.

7. The color filter substrate of claim 6, wherein the first layer pattern includes a metal having the ink affinity characteristic.

8. A color filter substrate comprising: a substrate; a thin film transistor disposed on the substrate; a passivation layer which covers the thin film transistor and exposes at least one of a source electrode and a drain electrode of the thin film transistor; a light blocking pattern disposed on only a portion of the exposed electrode and which surrounds an ink filling region; and a color filter which includes at least one of a red color filter, a green color filter, and a blue color filter disposed on the ink filling region, wherein the color filter is formed via inkjet printing, wherein an outer side of the exposed electrode has a reversed-taper shape such that a width of the first layer pattern increases with distance from the substrate.

* * * * *